US007813140B2

(12) United States Patent
Lam

(10) Patent No.: US 7,813,140 B2
(45) Date of Patent: *Oct. 12, 2010

(54) METHODS AND SYSTEMS FOR FILTERING SIGNALS

(75) Inventor: Cheung-Wei Lam, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/193,696

(22) Filed: Aug. 18, 2008

(65) Prior Publication Data

US 2009/0046440 A1 Feb. 19, 2009

Related U.S. Application Data

(62) Division of application No. 11/035,593, filed on Jan. 13, 2005, now Pat. No. 7,417,869.

(51) Int. Cl.
H05K 1/18 (2006.01)
(52) U.S. Cl. .................. 361/763; 361/760; 361/766; 361/780; 361/782; 361/821
(58) Field of Classification Search .......... 361/760, 361/761, 763, 766, 789, 782, 821, 790–795, 361/830, 748, 738, 765, 823
See application file for complete search history.

(56) References Cited

U.S. PATENT DOCUMENTS 5,926,377 A 7/1999 Nakao et al.

| 6,337,798 | B1* | 1/2002 | Hailey et al. ........... 361/763 |
| 6,353,540 | B1 | 3/2002 | Akiba et al. |
| 6,442,041 | B2 | 8/2002 | Rehm et al. |
| 6,798,666 | B1 | 9/2004 | Alexander et al. |
| 7,035,082 | B2* | 4/2006 | Jow et al. ............ 361/306.3 |
| 2002/0172023 | A1 | 11/2002 | Blakely et al. |
| 2004/0027813 | A1* | 2/2004 | Li .................... 361/767 |
| 2005/0057905 | A1 | 3/2005 | He et al. |
| 2005/0228810 | A1* | 10/2005 | Modjeski et al. ......... 707/101 |

OTHER PUBLICATIONS

Snogren, Richard. "Embedded Passives: The Next Revolution," *PC FAB*, pp. 26-29, Nov. 2002.
Peiffer, Joel S. "Fabrication of Embedded Capacitance Printed Circuit Boards," *IPC Printed Circuits EXPO 2001*, pp. S08-3-1 through S08-3-5, 2001.
Zeeff, Theodore M. "Analysis of Simple Two-Capacitor Low-Pass Filters," *IEEE Transactions in Electromagnetic Compatibility*, 45(4):595-601, Nov. 2003.

* cited by examiner

*Primary Examiner*—Dameon E Levi
*Assistant Examiner*—Hoa C Nguyen
(74) *Attorney, Agent, or Firm*—Blakely, Sokoloff, Taylor & Zafman LLP

(57) ABSTRACT

The present invention describes methods for enhancing the performance of two-capacitor low-pass filters. In certain embodiments of the invention, the capacitors are placed on opposite sides of a PCB board.

7 Claims, 16 Drawing Sheets

METHODS AND SYSTEMS FOR FILTERING SIGNALS

This application is a divisional of U.S. patent application Ser. No. 11/035,593, filed on Jan. 13, 2005 now U.S. Pat. No. 7,417,869.

FIELD OF THE INVENTION

The present invention relates to data processing systems, such as computers, and, in particular, to a capacitive low-pass filter for a logic board in a data processing system.

BACKGROUND

Filtering and bypass capacitors are commonly used in high speed logic circuitry to reduce EMI emissions and internal noise and to improve immunity. Filtering performance is degraded at high frequencies by coupling (mutual inductance) between the input and output sides of the filter on the printed circuit board (PCB) layout. Known solutions include using two parallel capacitors and appropriately spacing the capacitors, typically, by placing them on opposite sides of a trace on one side of the PCB, or by separating them by a small distance along a trace on one side of the PCB.

Typical inexpensive low pass filters consist of a single capacitor. FIG. 1A exemplifies such a circuit, and shows a capacitor 103 of capacitance C connected between a signal line 101 and a ground line 102. The single-capacitor filter is only effective up to a few hundred megahertz, due to the mutual inductance that results from the current flowing through the capacitor coupling magnetic flux from one side of the filter 104 to the other 105. At higher frequencies, the impact of this mutual inductance causes attenuation to increase significantly, thus limiting the effectiveness of the filter.

FIG. 2A shows a perspective view of a multi-layer PCB 201 with a one-capacitor low-pass filter. The capacitor 202 is connected on one side to a signal trace 203 (that runs between two ports 204) and on the other to a via (through hole) 205 that buries through the layers of the PCB to connect to a lower ground layer.

FIG. 2B shows a top view of the same PCB and one-capacitor low-pass filter as in FIG. 2A.

A known alternative to single-capacitor filters is to employ two capacitors connected in parallel. Two-capacitor low pass filters are still low cost and a more effective alternative at high frequencies than single capacitor filters. FIG. 3 shows an exemplary circuit diagram. The capacitors 303 and 304 are each of half the capacitance of the single-capacitor case shown in FIG. 1 (103) and are connected, on the same side of the PCB, in parallel between a signal line 301 and a ground line 302. here are three associated inductance loops: an input loop 305 with self-inductance $L_1$, a middle loop 306 with self-inductance $L_2$, and an output loop 307 with self-inductance $L_3$. In addition, mutual inductances between the input and output loops ($M_{13}$) and input and middle loops ($M_{12}$) are also present and serve to further reduce performance at high frequencies.

FIG. 4 shows a top view of a PCB layout with a two-capacitor low-pass filter where the capacitors 402 & 403 are connected on the same side of the PCB and also on the same side of the trace 401 (a prior art layout) and to their respective ground vias 404 & 405.

FIG. 5 is a top view of a PCB with a two-capacitor low-pass filter layout where the two capacitors 502 & 503 are connected on opposite sides of the signal trace 501 (another prior art layout) but on the same aside of the PCB.

It has been found that increasing the physical separation between the two capacitors leads to an overall reduction in the mutual inductance and thus to enhanced performance. FIG. 6 exemplifies a prior art solution, showing a top view of a PCB where the two capacitors 602 & 603 are connected on the same side of the PCB and on the same side of the trace 601 but are separated by a distance 605, d=6 mm.

SUMMARY

The present invention relates a method to connect two filtering parallel capacitors by placing them on opposite sides of a PCB board, commonly connected by vias (through-holes). Such a layout provides the advantages of reduced mutual inductance —with the attendant improvement in filtering performance—of two parallel capacitors with a small separation distance. In addition, placing the capacitors on opposite sides of a PCB board takes advantage of the shielding provided by the ground planes in between the top and bottom layers of the PCB, further reducing the mutual inductance. Measurements show the filtering performance of the proposed invention is improved over the current art.

BRIEF DESCRIPTION OF THE DRAWINGS

The present invention is illustrated by way of example and not limitation in the figures of the accompanying drawings in which like references indicate similar elements.

DETAILED DESCRIPTION

The subject of the invention will be described with reference to numerous details and accompanying drawings set forth below. The following description and drawings are illustrative of the invention and are not to be construed as limiting the invention. Numerous specific details are described to provide a thorough understanding of the present invention. However, in certain instances, well known or conventional details are not described in order to not unnecessarily obscure the present invention. It will be apparent to one skilled in the art that the present invention may be practiced without these specific details.

Figure 1:
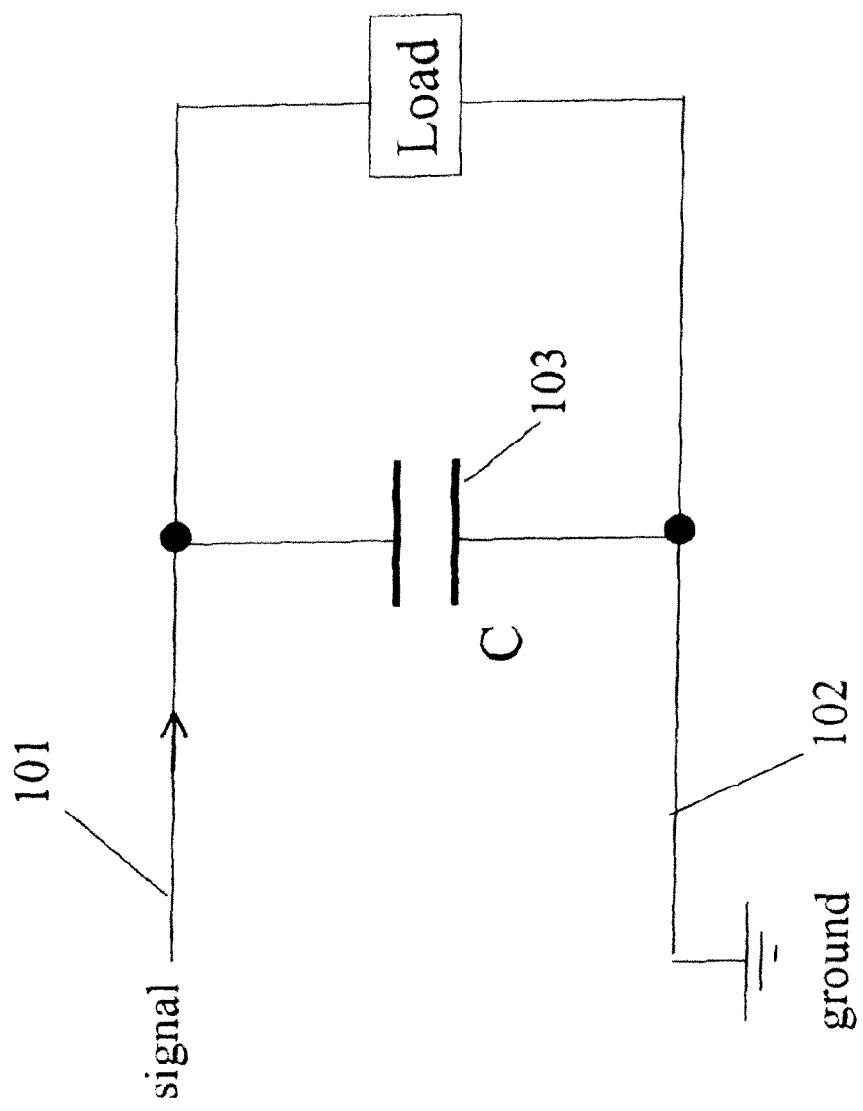
FIG. 1 shows a single-capacitor low-pass filter in the prior art.
Figure 2A:
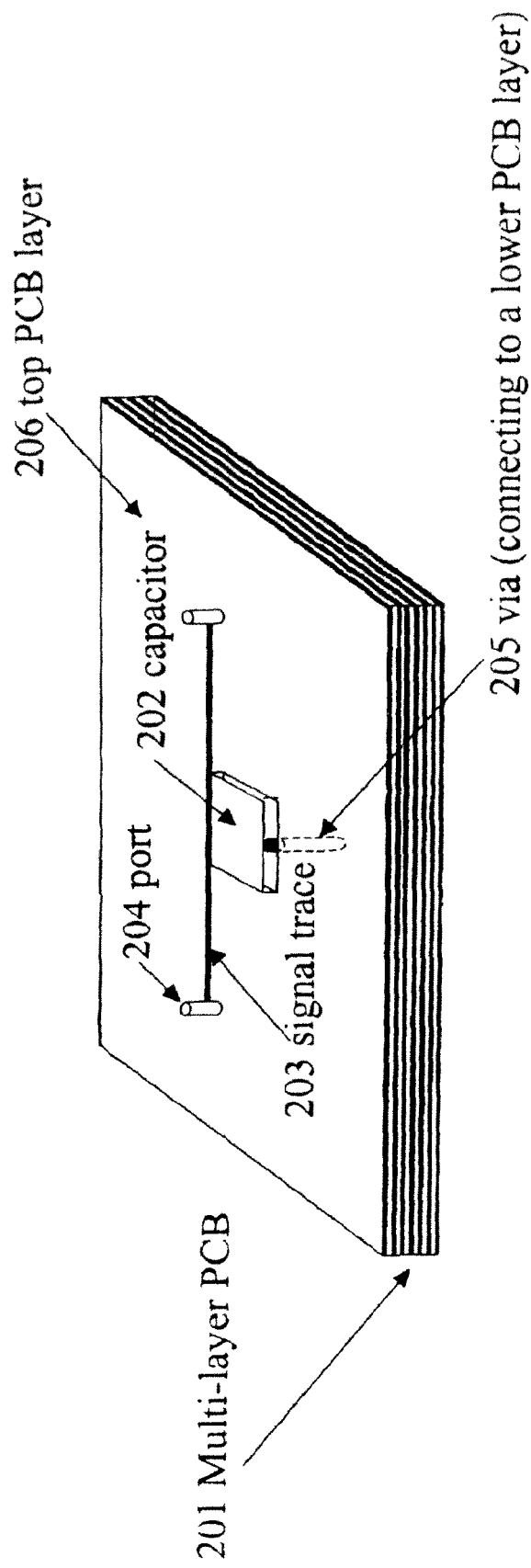
FIG. 2A shows a perspective view of a PCB with a one-capacitor low-pass filter.
Figure 2B:
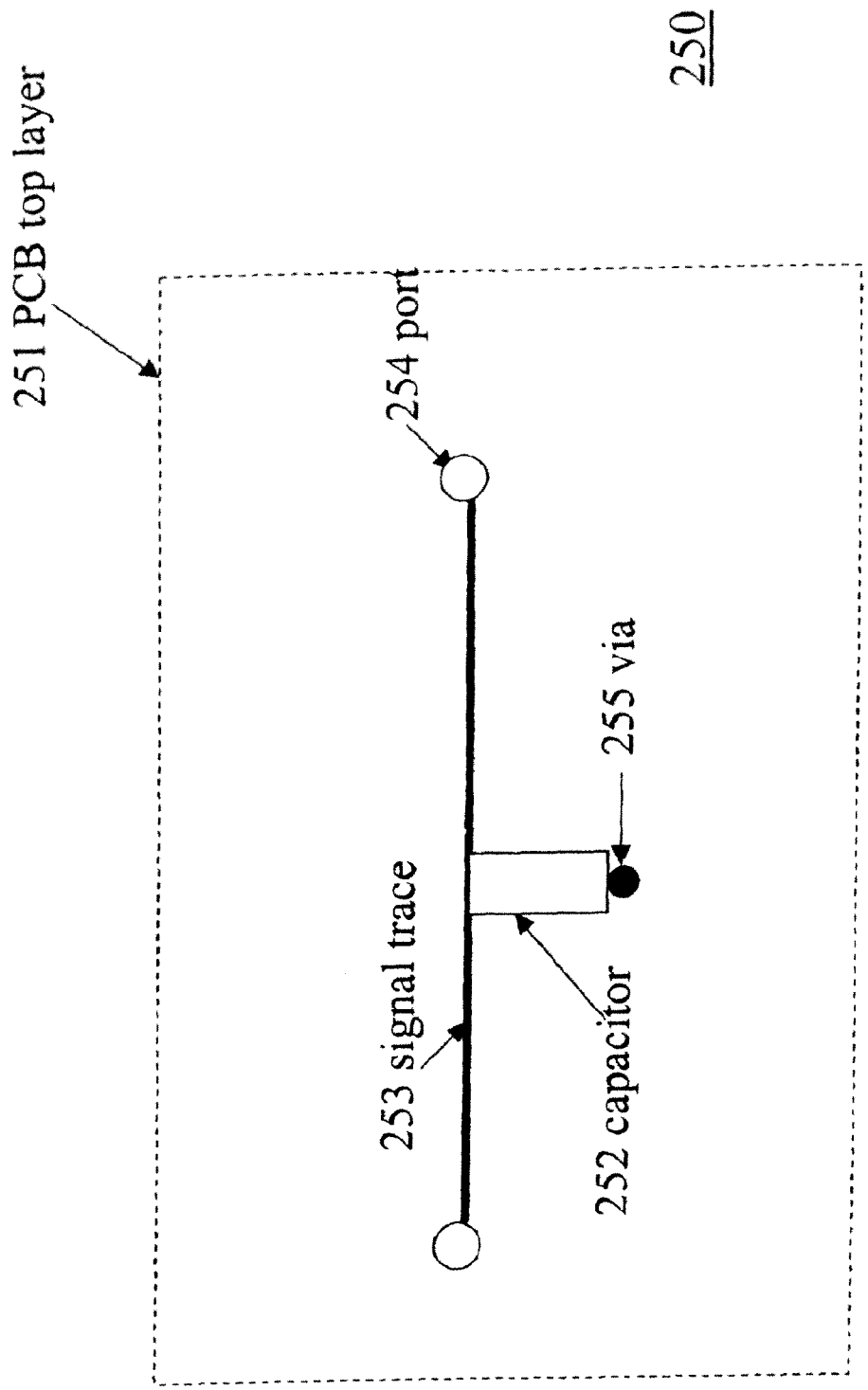
FIG. 2B shows the top view of the same PCB and one-capacitor low-pass filter as in FIG. 2A.
Figure 3:
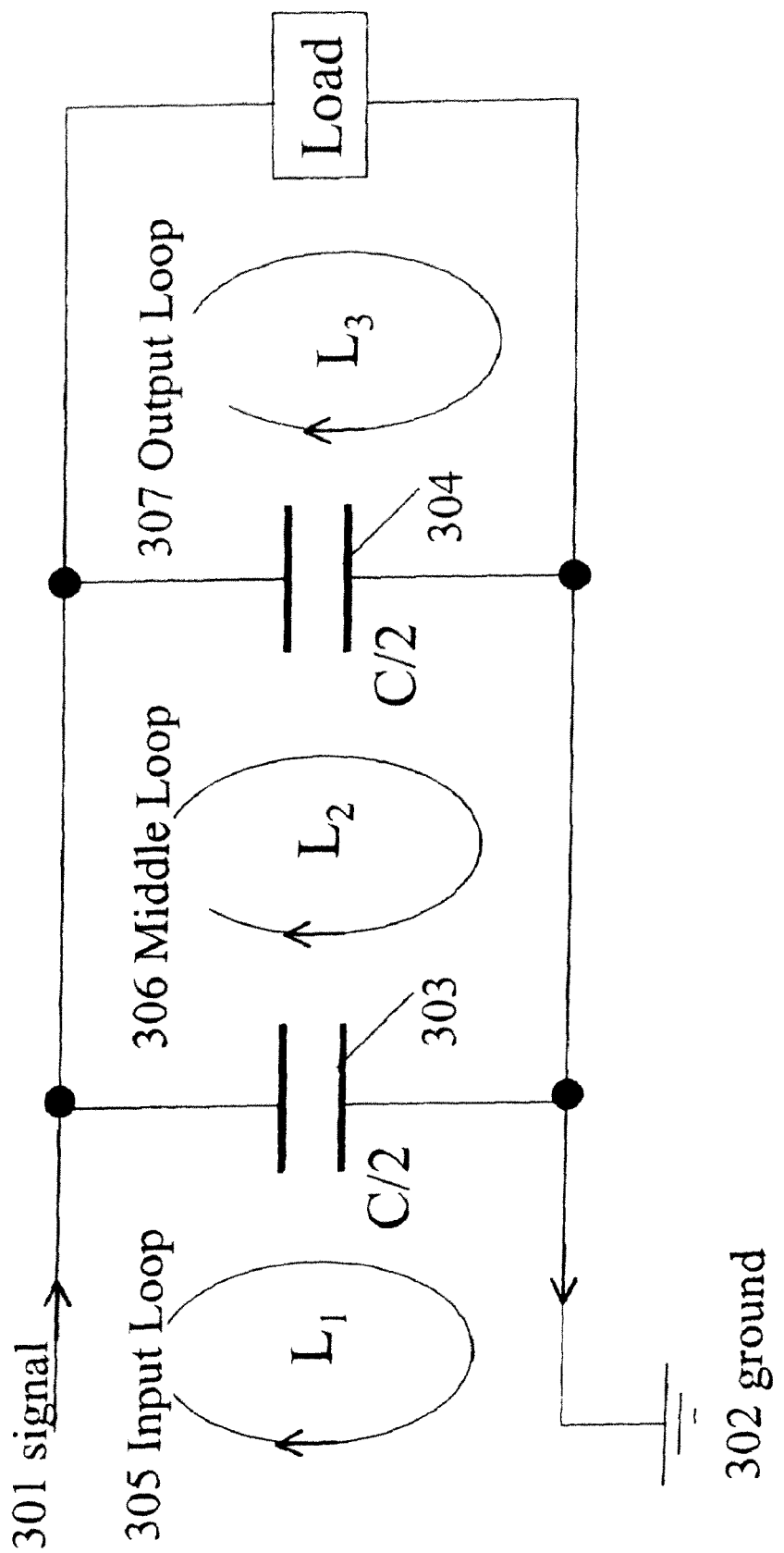
FIG. 3 shows a 2-capacitor low-pass filter in the prior art and the associated inductance loops.

The overall goal of the present invention, at least in certain embodiments, is to enhance low-pass filter performance by reducing the mutual inductance introduced when using two capacitors. It has been found that the physical separation, or spacing, between the two capacitors can be changed to reduce the overall mutual inductance and thus improve performance. In general, the larger the spacing between the capacitors, the smaller the mutual inductance between the input and output loops will be. However, due to space limitations and high component density in real PCB boards, in practice, the capacitors can only be spaced apart by a few millimeters, A paper by T. M. Zeeff, T. H Hubbing, T. P. Van Doren and D. Pommerenke titled "Analysis of a simple two capacitor low-pass filters", and appearing in IEEE transactions on Electromagnetic Compatibility. Vol. 45, No. 4, November 2003 (heretofore referred to as the "Zeeff paper"), has studied the optimum capacitor spacing for filter performance. The Zeeff paper found that for a two-capacitor low-pass filter, the optimum capacitor spacing would minimize the function:

$$(M_{12})^2/(L_2+M_{13})$$

where $L_i$ is the self-inductance of loop i, and $M_{ij}$ is the mutual inductance between loops i and j. FIG. 3 is a circuit diagram of a two-capacitor filter showing the three loops—an input, middle and output loop—and their related self-inductances, $L_i$. The mutual inductance $M_{12}$ results from the coupling of the current in the input and middle loops, while $M_{13}$ results from the coupling of the input and output loops. As the capacitors are spaced further apart, the mutual inductance is reduced.

The equation above implies, as stated previously, that the spacing should be as large as possible since, in that case, $M_{13}$ would approach zero and $L_2$ would increase proportional to the loop width as the middle loop is widened.

The present invention, in at least certain embodiments, reduces $M_{13}$ to near zero and increases $L_2$ while not requiring an impractically large spacing between the capacitors. The capacitors, in at least certain embodiments, are connected on opposite sides of the PCB such that the signal trace runs on opposite sides of the board. In the case where there is a single ground plane in the PCB, the inductance of the second loop, $L_2$, would include the signal via inductance and the ground via inductance.

In the case of multiple ground planes, in order to further increase $L_2$, the ground via can be "routed" across the ground planes to effectively increase the relative distance between the signal and ground vias (i.e. to widen the middle loop, thus increasing $L_2$—which in these cases also depends on the ground planes). Likewise, the signal via can also be routed across planes to increase $L_2$ by widening the middle loop.

Lastly, an added advantage of mounting the capacitors on opposite sides of the PCB comes from the ground planes in between the top and bottom layers where the capacitors are mounted. The ground planes provide shielding between the capacitors, which reduces the mutual inductance, $M_{13}$, to nearly zero (because the ground planes shield the input loop from the output loop and vice versa).

The two-prong effect (separation and shielding) of placing the capacitors on opposite sides of the PCB provides an efficient, inexpensive way to obtain improved filtering at high-frequencies. Measurements show that filtering performance of the proposed invention is superior to the current art.

Figure 7A:
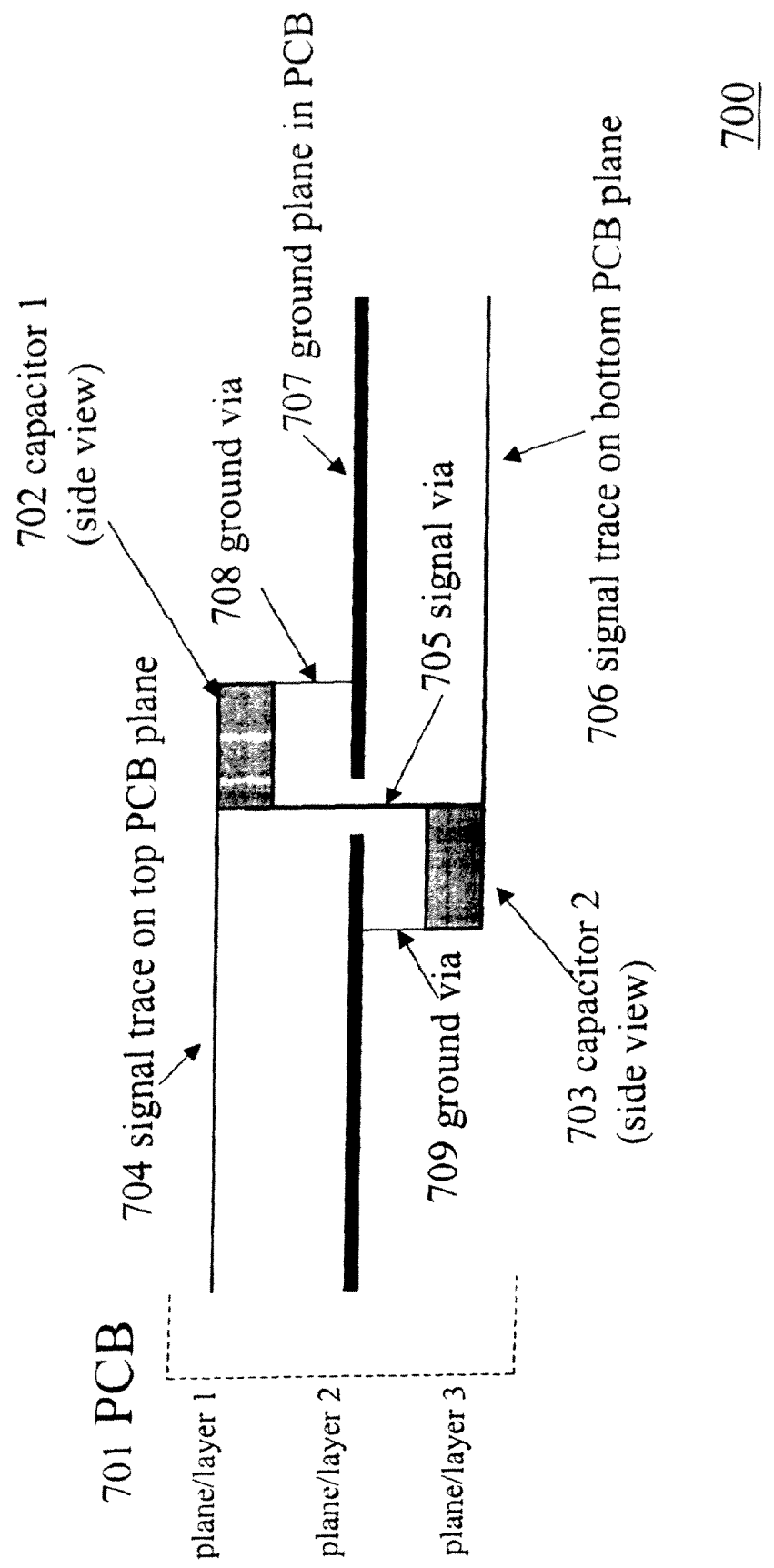
FIG. 7A shows a side view of one embodiment of invention, where the two parallel capacitors are connected on opposite sides of a 3-layer PCB.

FIG. 7A shows a side view of one embodiment of invention, where the two parallel capacitors 702 & 703 are connected on opposite sides of a 3-layer PCB 701. Thus, the PCB 701 physically separates the two capacitors 702 & 703 so that they are on opposite sides of the PCB 701. The signal trace runs on the top PCB plane 704, through a signal via 705 down the inner layers of the board to the bottom PCB plane 706. Each capacitor is also connected to a ground plane 707 (within the PCB board) by means of individual ground vias 708 & 709.

Figure 7B:
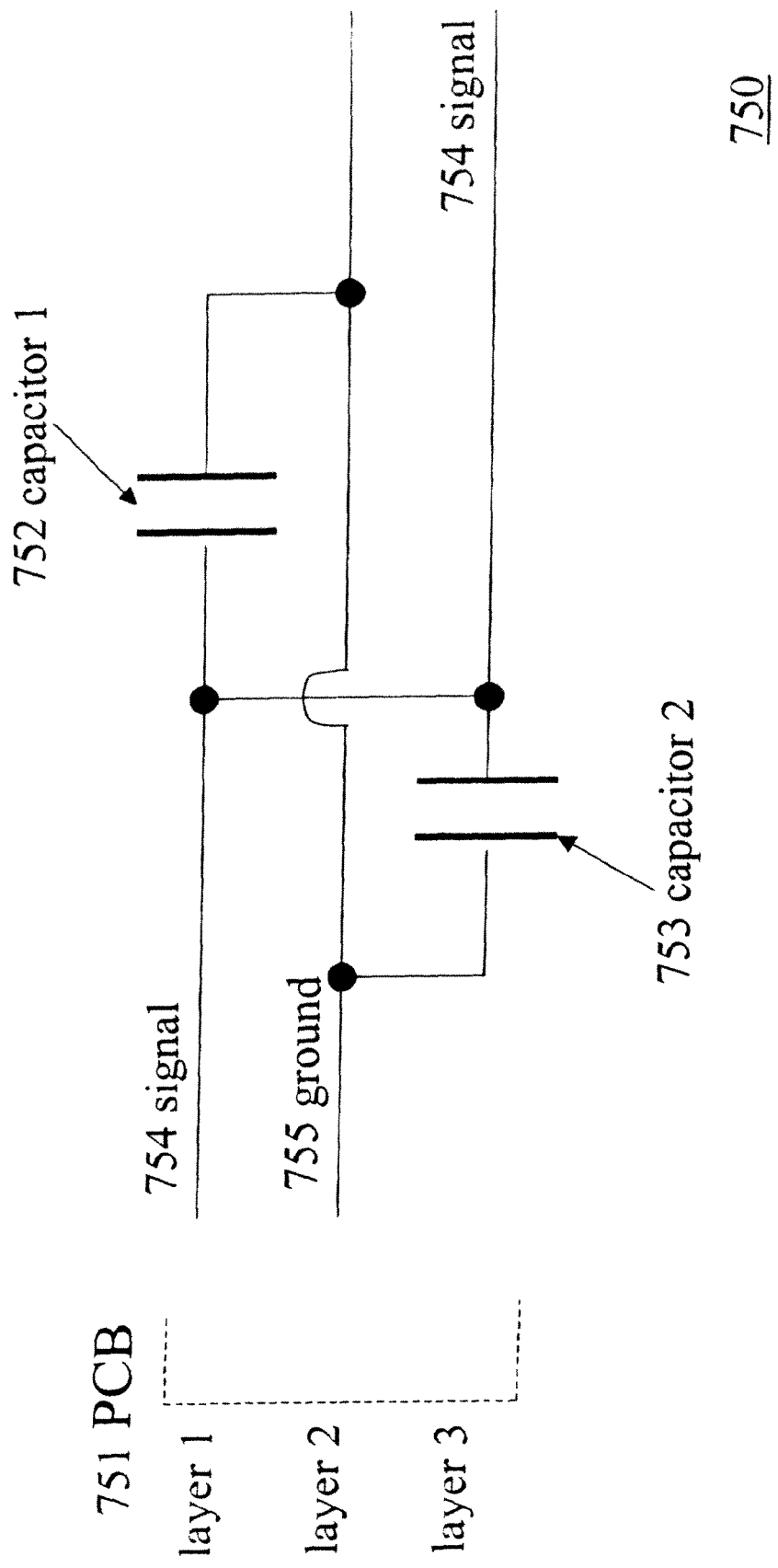
FIG. 7B shows the equivalent circuit (as in FIG. 9A) in 3-layer PCB.

FIG. 7B shows the equivalent circuit diagram (for the 3-layer PCB of FIG. 7A 751), where the capacitors 752 & 753 are connected in parallel to a signal line 754 and ground 755.

Figure 4:
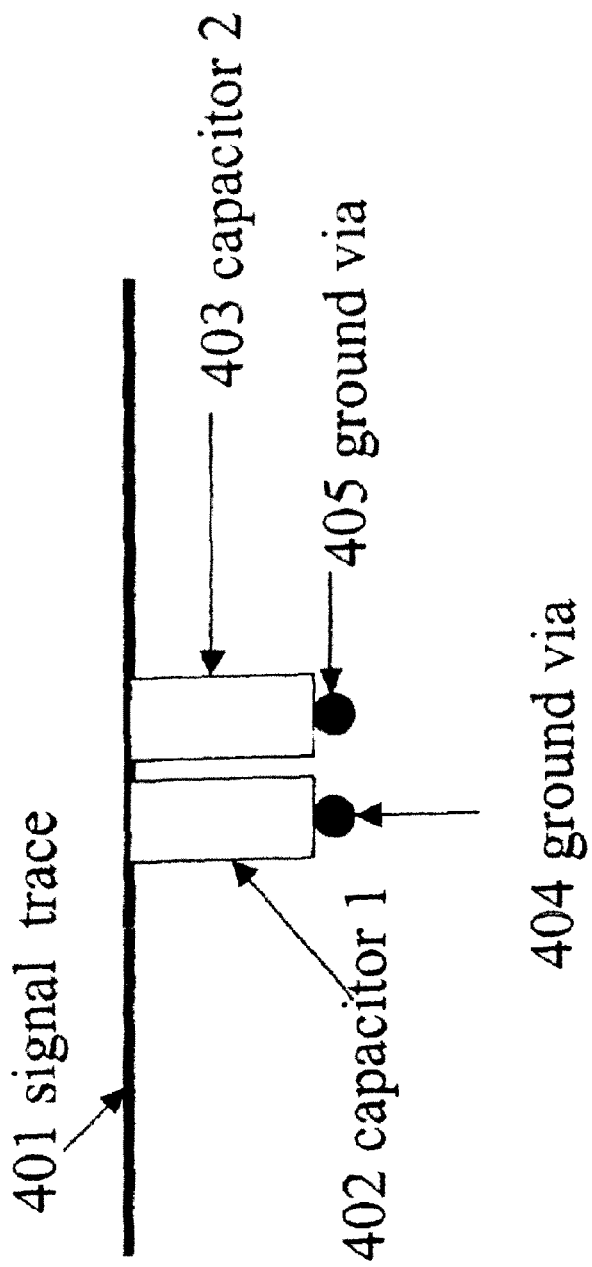
FIG. 4 shows a top view of a PCB with two-capacitor low-pass filter where the capacitors on the same side of the trace (a prior art layout).
Figure 5:
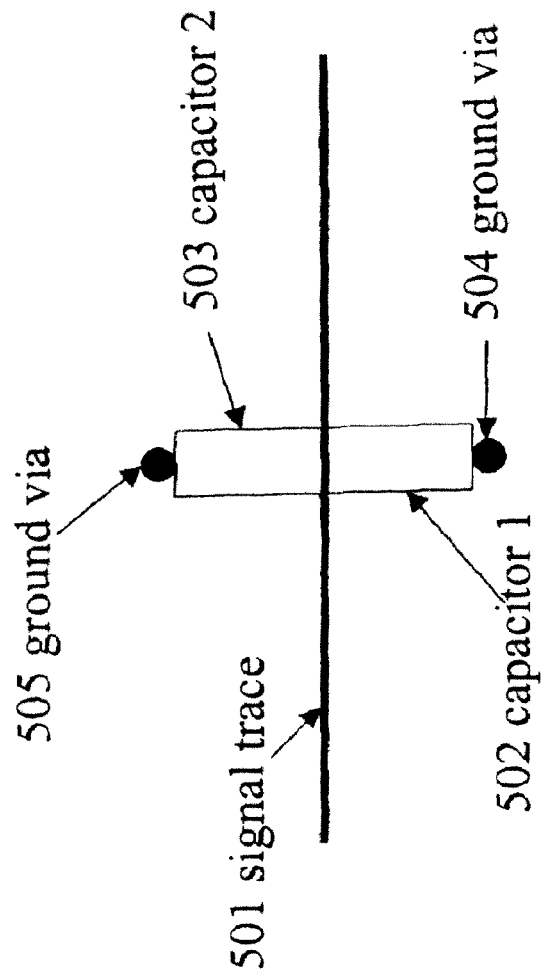
FIG. 5 shows a top view of PCB with two-capacitor low-pass filter where the two capacitors are on opposite sides of the trace (a prior art layout).
Figure 6:
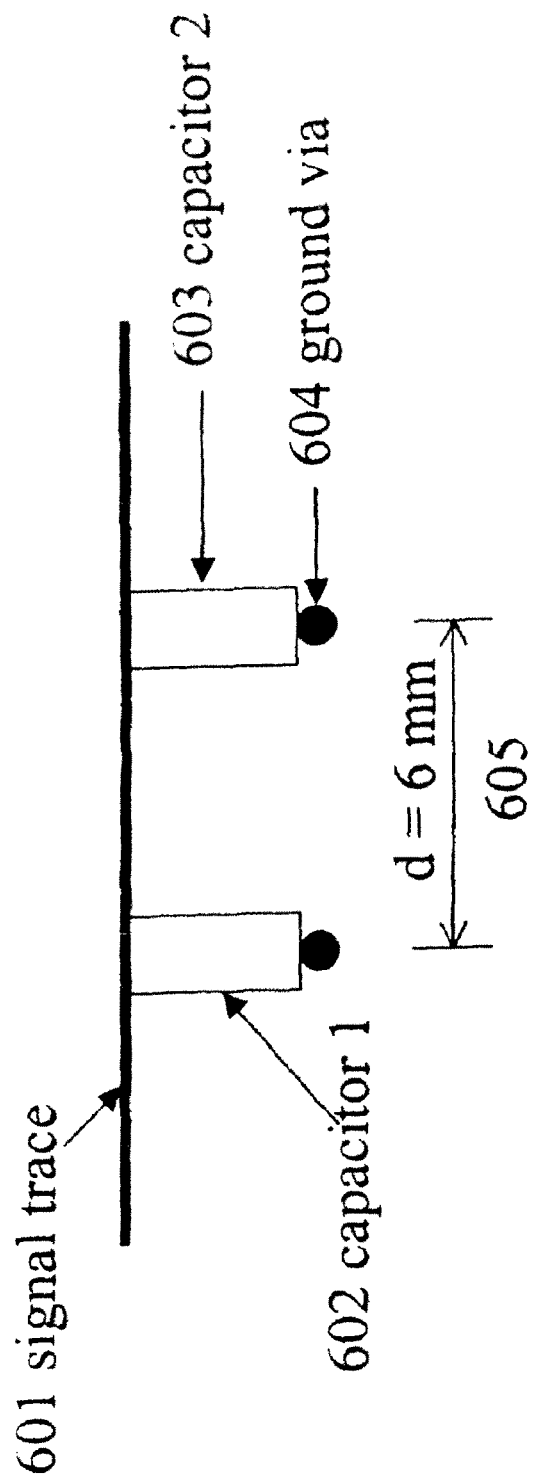
FIG. 6 shows a top view of a PCB with the two capacitors on the same side of the trace and separated by a distance of 6 mm (a prior art layout).
Figure 8:
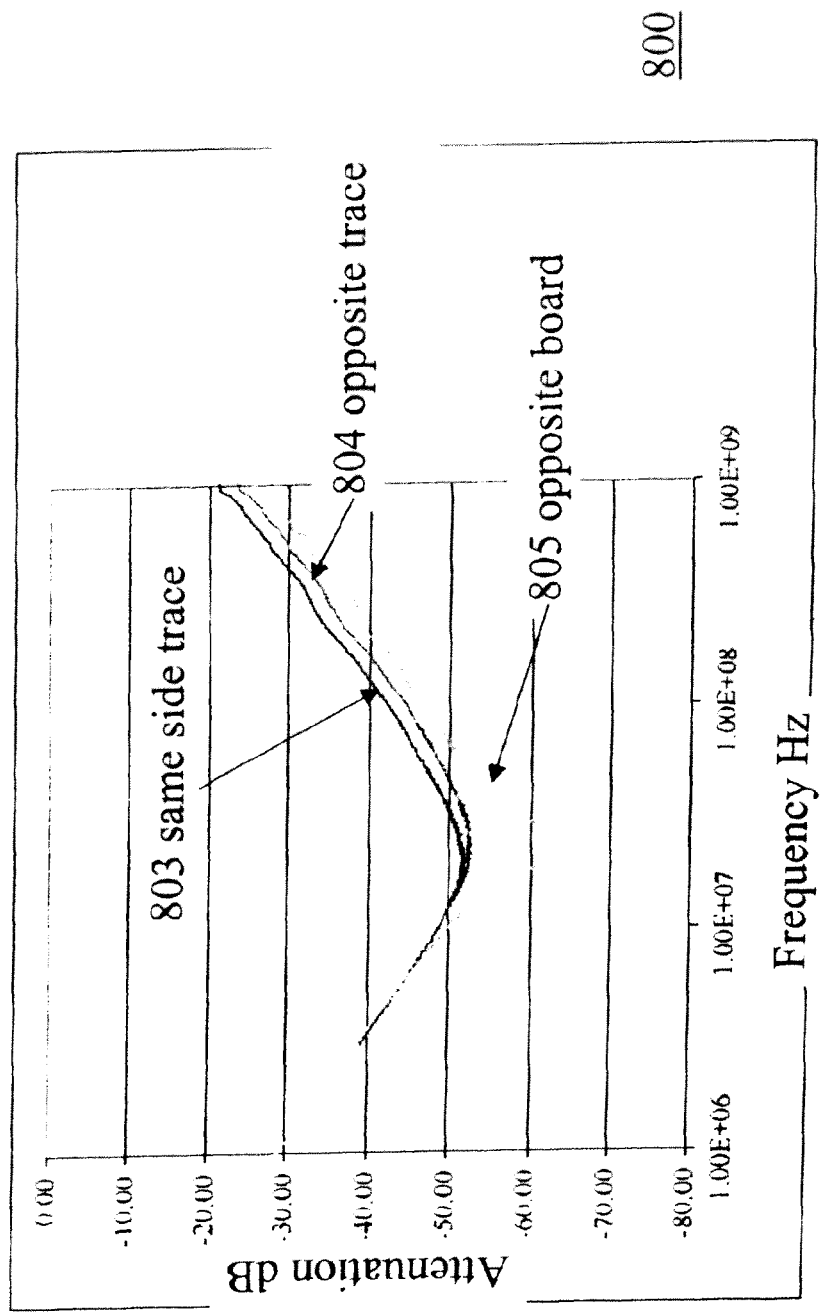
FIG. 8 is a plot of the Attenuation (dB) versus Frequency (Hz) for various two-capacitor filter configurations.

FIG. 8 plots the Attenuation 801 (measured in deciBells, dB) versus Frequency 802 (measured in Hertz, Hz) profile for three two-capacitor filter configurations. Specifically, the plot compares the performance curve of the present invention to another two two-capacitor filters: a layout where the two capacitors are on the same side of the signal trace 803 (but still on the same PCB plane) as illustrated in FIG. 4, and a configuration where the capacitors are placed on opposite sides of the signal trace 804 (but still on the same PCB plane) as illustrate by FIG. 5. By comparison, certain embodiments of the present invention the present invention place the capacitors on opposite planes of the PCB, and are represented by curve 805. Clearly, the performance curve of the present invention 805 results in lower attenuation at high frequencies than the other two curves, 803 & 804. Hence, the filtering performance of the proposed invention is improved over the current art shown.

A second aspect of at least certain embodiments of the invention relates to shielding of the capacitors from one another by the ground planes in the PCB. An additional boost in filter performance resulting from mounting the capacitors on opposite sides of the PCB is supplied by the shielding of ground planes found in between the top and bottom layers where the capacitors are mounted. This shielding, at least in certain embodiments of the invention, reduces the mutual inductance, $M_{13}$, to nearly zero (because the ground planes shield the input loop from the output loop and vice versa).

Figure 9A:
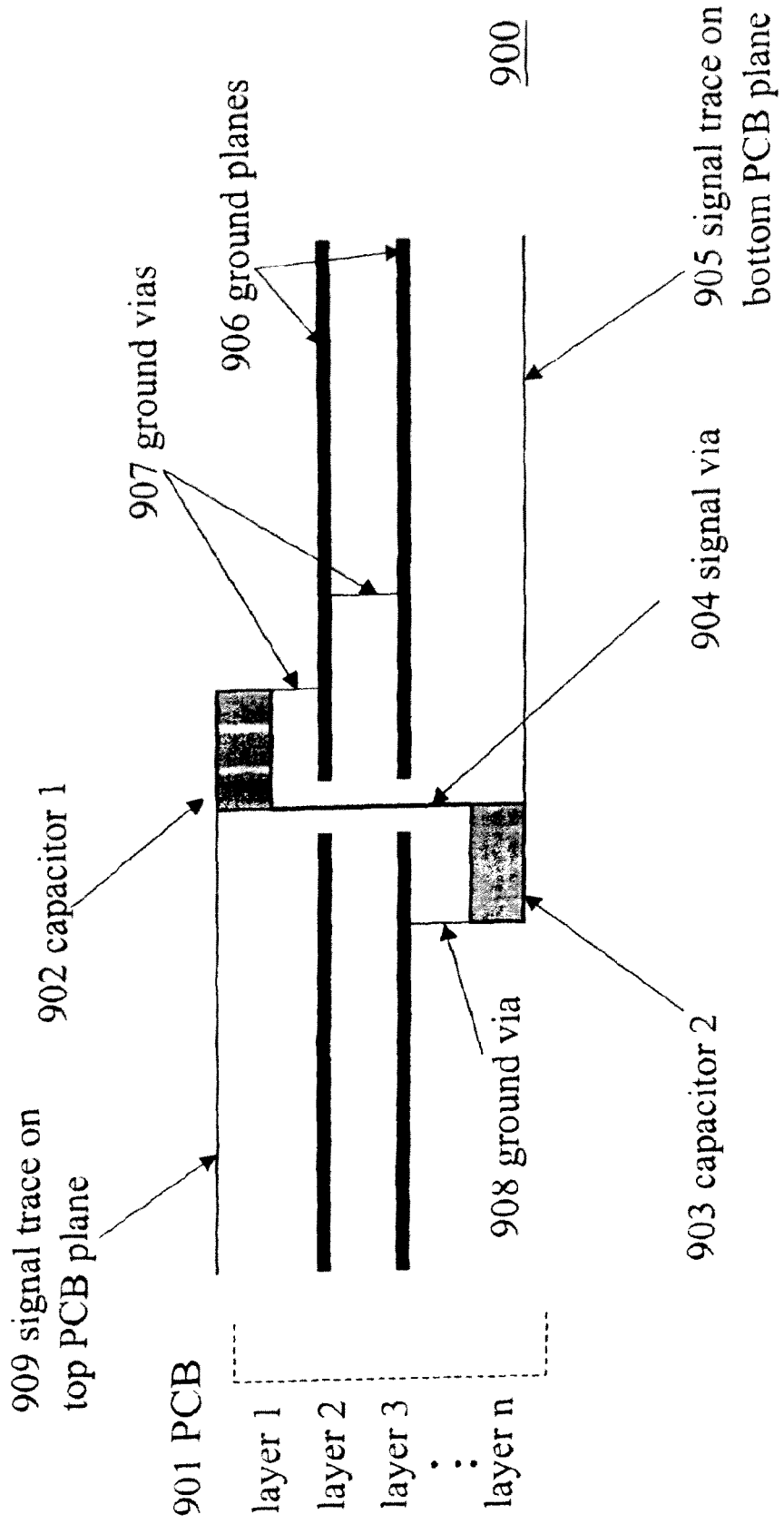
FIG. 9A is a side view of a multi-layer PCB with an exemplary embodiment of the invention, where the two capacitors are connected in parallel across the layers of the PCB.

FIG. 9A is a side view of a multi-layer PCB 901 with an exemplary embodiment of the invention, where the two capacitors 902 & 903 are connected in parallel across the layers of the PCB, such that the signal trace runs from the top of the plane 909, through the inner layers of the PCB by a via 904 and down to the bottom PCB plane 905. Each capacitor 902 & 903 is connected to a ground plane 906 by ground vias 907 & 908.

Figure 9B:
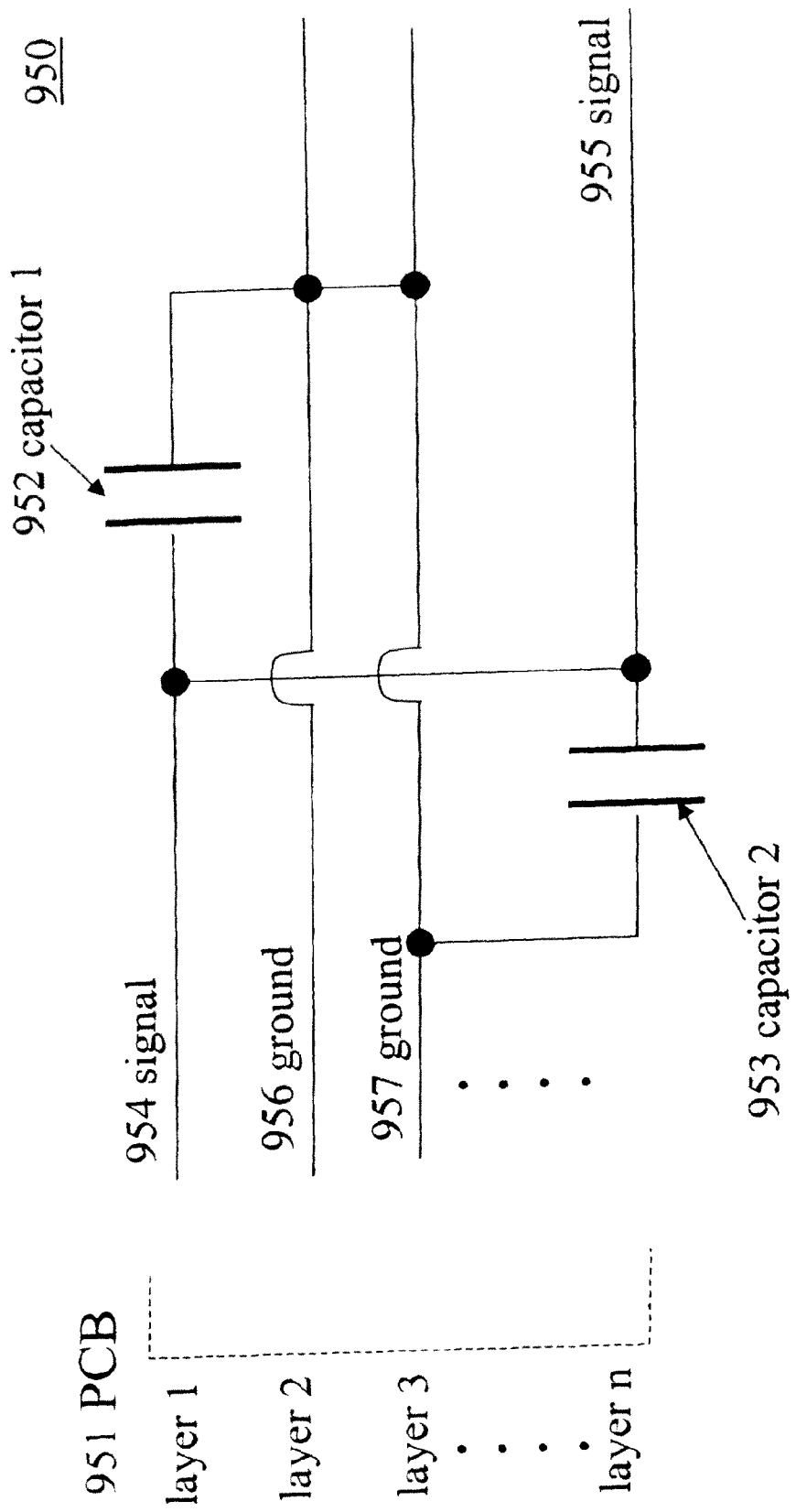
FIG. 9B shows the equivalent circuit in a multi-layer PCB (as in FIG. 10A).

FIG. 9B shows the equivalent connectivity as in FIG. 9A in circuit diagram form. The layers of the PCB 951 are shown as signal lines 954 & 955—on the top and bottom of the PCB plane, respectively—and the ground planes within the PCB are shown as ground lines 956 & 957. The two capacitors 952 & 953 are connected to each other in parallel between the signal and ground lines.

Figure 10:
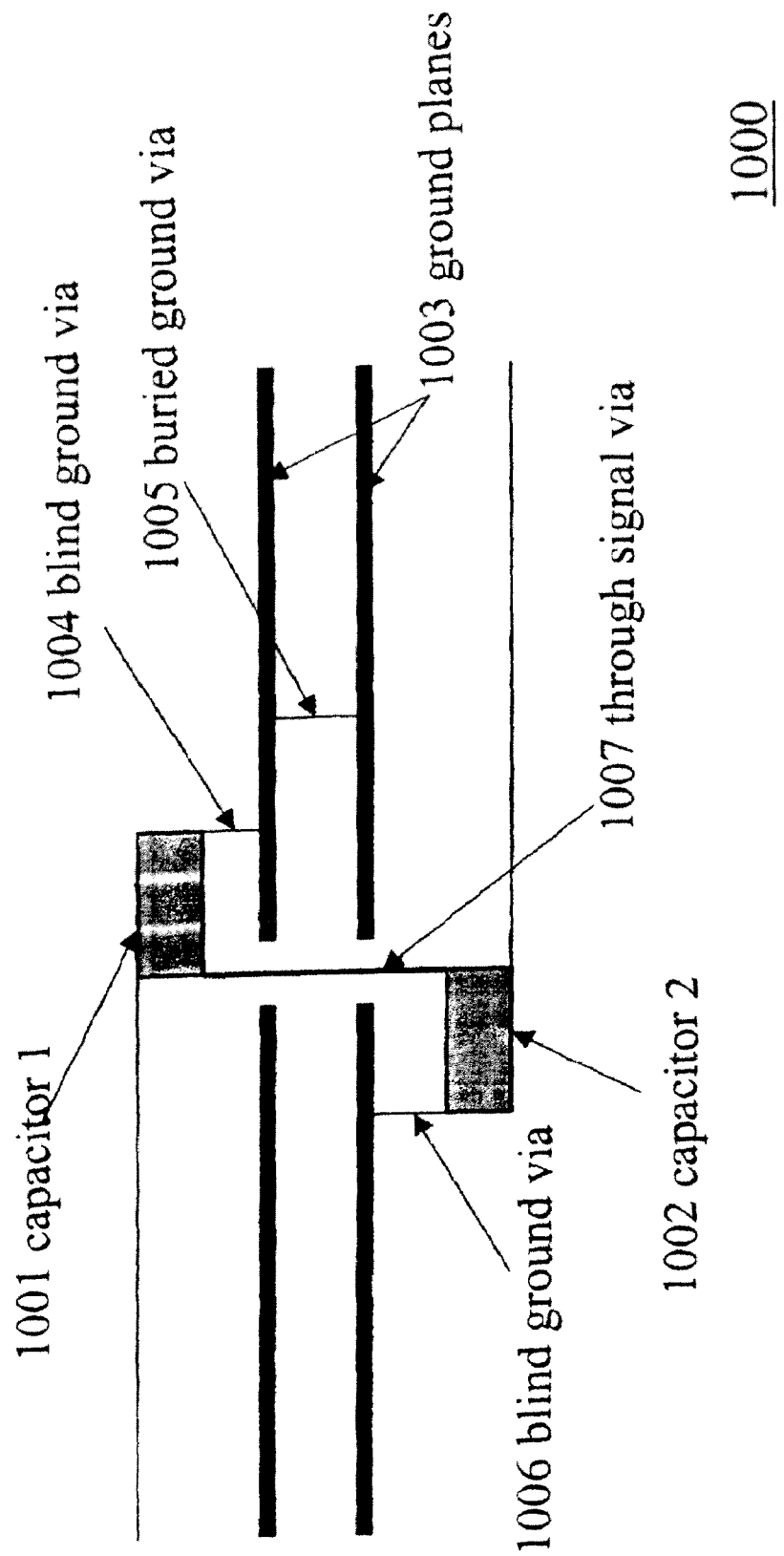
FIG. 10 shows one embodiment of the invention, whereby the connection of the capacitors to the ground plane is made using buried ground vias.

FIG. 10 shows an exemplary PCB layout where the ground vias used to connect the first capacitor 1001 to the ground planes 1003 are a combination of a blind 1004 and a buried via 1005. Blind vias connect one or more of the inner layers with one of the surface layers without penetrating the whole board, while buried vias only connect inner layers of the board.

Figure 11:
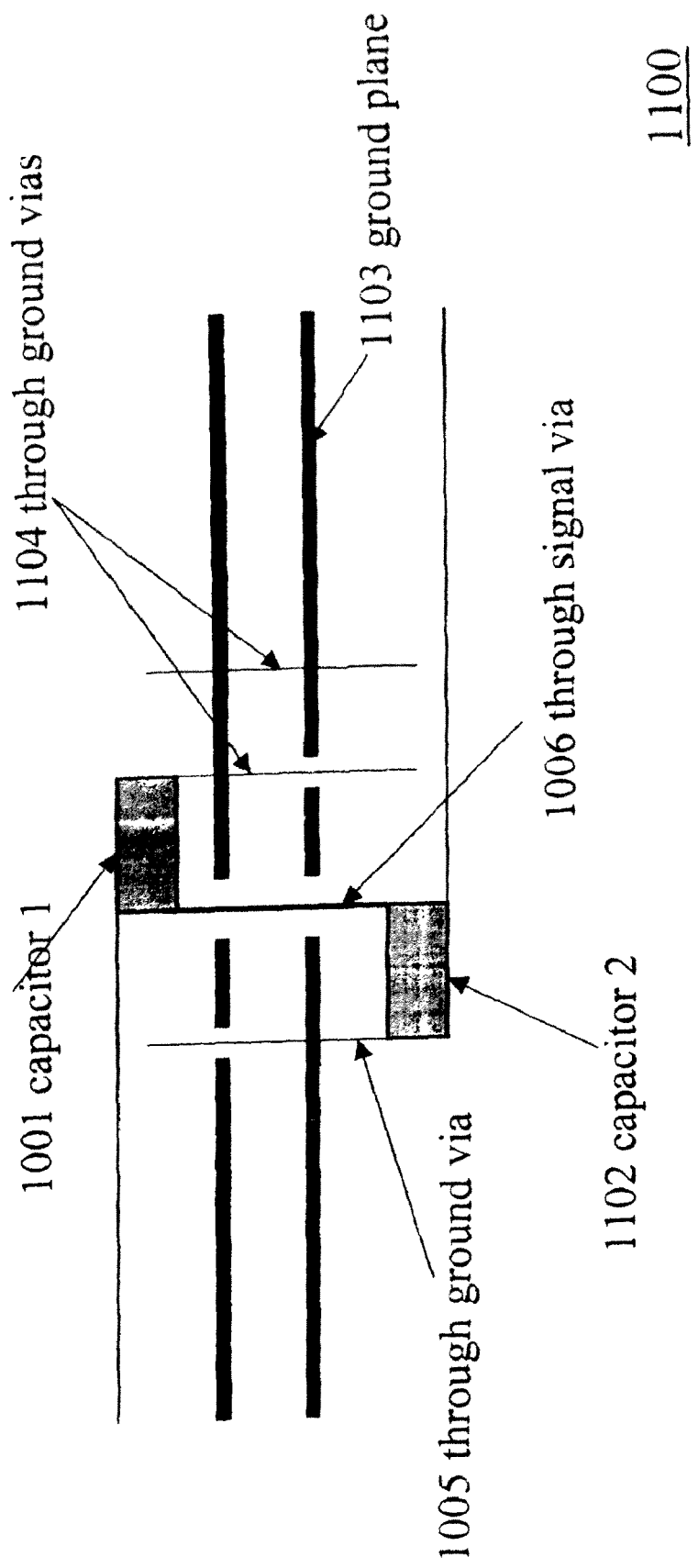
FIG. 11 shows another embodiment of the invention, whereby the connection of the capacitors to the ground plane is made using through ground vias.

FIG. 11 shows another such possibility, where the connection of each capacitor 1101 & 1102 to its ground plane 1103 is made using through vias 1104 & 1105, respectively. In contrast to blind and buried vias, through vias penetrate the whole board.

A third aspect of at least certain embodiments of the invention in the case of multi-layer PCBs involves further increasing the middle loop inductance by means of routing either (or both) of the ground and signal vias away from each other across multiple planes. Such routing has the equivalent effect of widening the middle loop between the capacitors, which in turn increases $L_2$, thereby improving performance for those embodiments that use this aspect of the invention.

Figure 12:
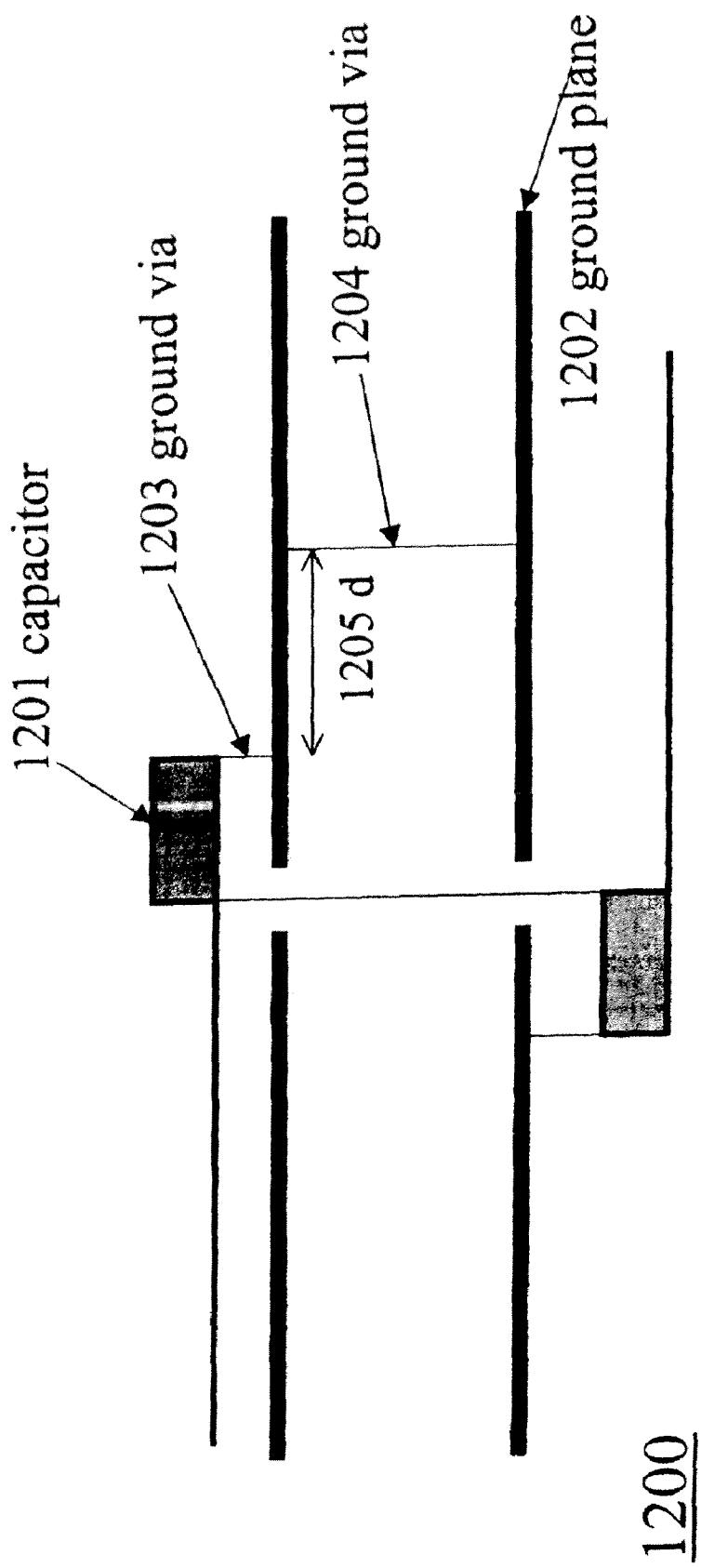
FIG. 12 illustrates one aspect of the invention, whereby moving the relative distance between the signal and ground vias, by routing the ground vias, reduces the mutual inductance.

FIG. 12 illustrates one aspect of the invention, whereby the connection of the first capacitor 1201 to a ground plane 1202 is made with two vias 1203 & 1204. The second via 1204 has been moved by distance d 1205 to effectively increase the middle loop inductance. Such an increase in the middle loop inductance can also be achieved with routing of the signal via. In addition, computer software could be employed to produce the routing path of the vias. Routing software could be particularly useful in difficult cases where there are many layers and there is little room to accommodate the routing, or to produce optimal via routing paths according to specific performance criteria.

Figure 13:
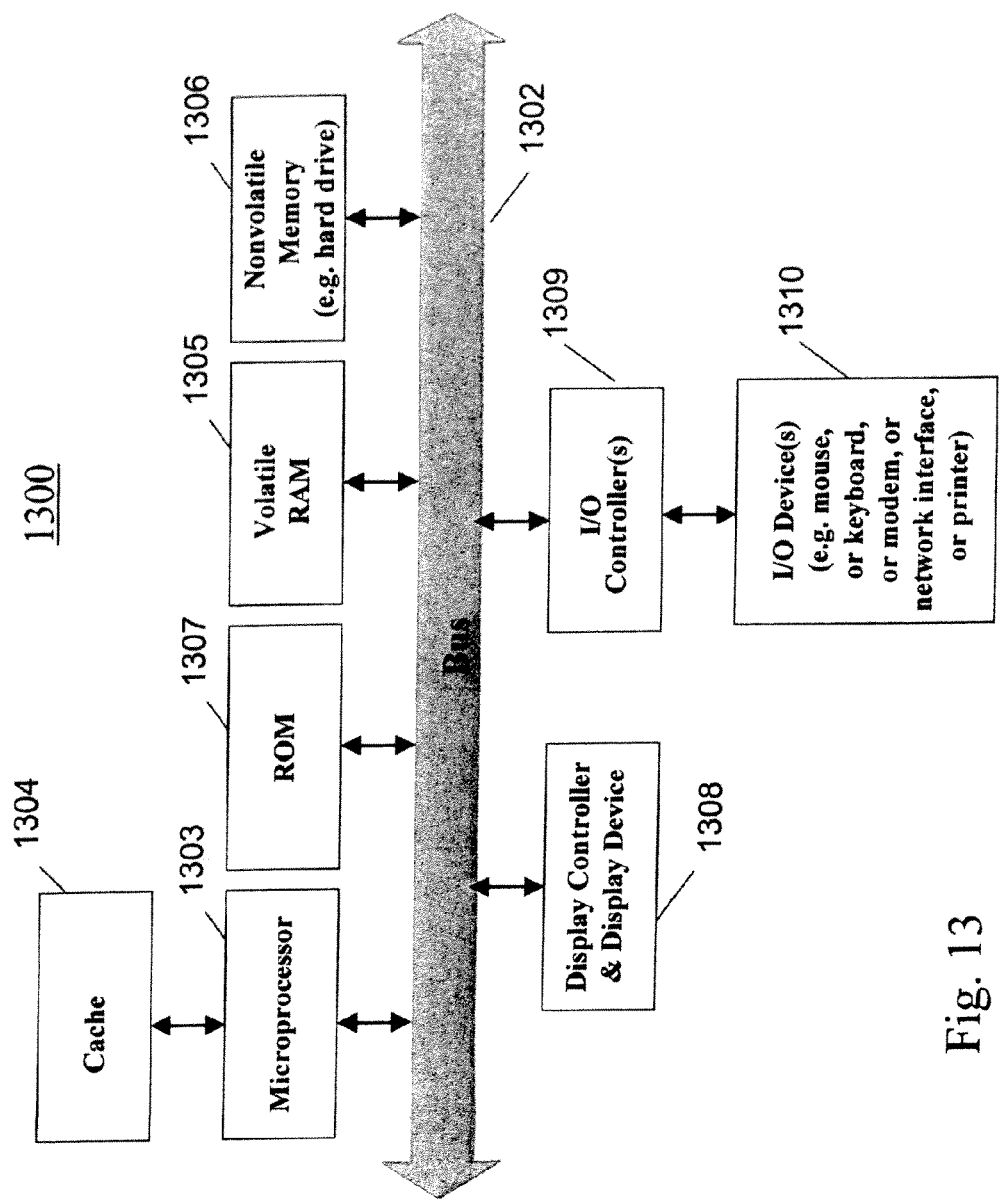
FIG. 13 is a block diagram of a digital processing system which may incorporate a digital processing board embodying the present invention.

FIG. 14 is a block diagram of a digital processing system which may incorporate a digital processing board embodying the present invention. Note that while FIG. 13 illustrates various components of a computer system, it is not intended to represent any particular architecture or manner of interconnecting the components, as such details are not germane to the present invention. It will also be appreciated that network computers, handheld computers, cell phones, peripheral devices (e.g. storage devices, printers, MP3 players, etc.) and other data processing systems which have fewer components or perhaps more components may also be used with the present invention. The computer system of FIG. 13 may, for example, be an Apple Macintosh computer.

As shown in FIG. 13, the computer system 1300, which is a form of a data processing system, includes a bus 1302 which is coupled to a microprocessor 1303 and a ROM 1307, a volatile RAM 1305, and a non-volatile memory 1306. The microprocessor 1303, which may be a PowerPC G3 or PowerPC G4 microprocessor from Motorola, Inc. or IBM, is coupled to cache memory 1304 as shown in the example of FIG. 14. The bus 202 interconnects these various components together and also interconnects these components 1303, 1307, 1305, and 1306 to a display controller and display device 208, as well as to input/output (I/O) devices 1310, which may be mice, keyboards, modems, network interfaces, printers, and other devices which are well-known in the art. Typically, the input/output devices 1310 are coupled to the system through input/output controllers 1309. The volatile RAM 1305 is typically implemented as dynamic RAM (DRAM) which requires power continuously in order to refresh or maintain the data in the memory. The non-volatile memory 1306 is typically a magnetic hard drive, a magnetic optical drive, an optical drive, or a DVD RAM or other type of memory system which maintains data even after power is removed from the system. Typically the non-volatile memory will also be a random access memory, although this is not required. While FIG. 13 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 1302 may include one or more buses connected to each other through various bridges, controllers, and/or adapters, as is well-known in the art. In one embodiment, the I/O controller 1309 includes a USB (Universal Serial Bus) adapter for controlling USB peripherals.

In the foregoing specification, the invention has been described with reference to specific exemplary embodiments thereof. It will be evident to those skilled in the art that various modifications may be made thereto without departing from the broader spirit and scope of the invention as set forth in the following claims. For example, the circuit board (e.g. PCB) used with various embodiments may be a flexible ("flex circuit") type of substrate rather than a rigid PCB. The specification and drawings are to be regarded in an illustrative sense rather than a restrictive sense. Accordingly, the present invention is to be defined only by reference to the appended claims and equivalents thereof.

What is claimed is:

1. An electronic assembly, comprising:
    a circuit board having a first exterior surface which defines a first plane and a second exterior surface which defines a second plane which is different than the first plane;
    a first capacitor attached to the first exterior surface;
    a second capacitor attached to the second exterior surface; and
    a signal line and a voltage reference line, wherein the first capacitor and the second capacitor are connected to each other in parallel between the signal line and the voltage reference line, wherein the capacitors are embedded in the circuit board, and wherein the signal line has a first portion disposed toward the first exterior surface and a second portion disposed toward the second exterior surface with the first and second portions connected by a via through the circuit board.

2. An electronic assembly of claim 1, wherein the capacitors are disposed on a same plane of the circuit board.

3. An electronic assembly of claim 1, wherein the capacitors are disposed on different planes of the circuit board.

4. A data processing system comprising an electronic assembly, comprising:
    a circuit board having a first exterior surface which defines a first plane and a second exterior surface which defines a second plane which is different than the first plane;
    logic circuitry attached to the circuit board;
    a first capacitor attached to the first exterior surface;
    a second capacitor attached to the second exterior surface; and
    a signal line and a voltage reference line, wherein the first capacitor and the second capacitor are connected to each other in parallel between the signal line and the voltage reference line, and wherein the signal line has a first portion disposed toward the first exterior surface and a second portion disposed toward the second exterior surface with the first and second portions connected by a via through the circuit board.

5. The system of claim 4, wherein the data processing system has a bus and a memory coupled to the bus.

6. The system of claim 4, wherein the data processing system has a bus and input and output coupled to the bus.

7. The system of claim 4, wherein the data processing system has a bus and a processor coupled to the bus.

* * * * *

UNITED STATES PATENT AND TRADEMARK OFFICE
CERTIFICATE OF CORRECTION

Page 1 of 1

PATENT NO.         : 7,813,140 B2
APPLICATION NO.    : 12/193696
DATED              : October 12, 2010
INVENTOR(S)        : Cheung-Wei Lam It is certified that error appears in the above-identified patent and that said Letters Patent is hereby corrected as shown below:

In column 4, line 30, delete "deciBells" and insert -- decibels --, therefor.

Signed and Sealed this
Fifteenth Day of November, 2011

David J. Kappos
*Director of the United States Patent and Trademark Office*